United States Patent [19]

Griesshammer et al.

[11] 4,062,714
[45] Dec. 13, 1977

[54] PROCESS FOR MAKING HOLLOW SILICON BODIES AND BODIES UTILIZING BOARD-SHAPED MEMBERS TO FORM THE BASIC GEOMETRIC SHAPE SO MADE

[75] Inventors: Rudolf Griesshammer, Burghausen; Franz Köppl, Altotting; Alois Göppinger; Helmut Hamster, both of Burghausen, all of Germany; Josef Thalmeier, Braunau, Austria

[73] Assignee: Wacker-Chemitronic Gesellschaft fur Elektronik Grundstoffe mbH, Burghausen, Germany

[21] Appl. No.: 704,889

[22] Filed: July 13, 1976

[30] Foreign Application Priority Data

Sept. 16, 1975 Germany .............................. 2541215

[51] Int. Cl.² ........................ H01L 21/20; B29D 23/00
[52] U.S. Cl. ........................... 156/304; 148/174;
156/613; 264/61; 264/81; 264/104; 427/86;
427/248 R
[58] Field of Search ............... 148/174, 175; 427/88,
427/248 R; 156/612–614, 304; 423/348–350;
264/60, 61, 65, 66, 81, DIG. 57, DIG. 64, 82,
104, 261

[56] References Cited

U.S. PATENT DOCUMENTS

| 2,409,958 | 10/1946 | Rogers et al. | 264/1 |
| 3,030,189 | 4/1962 | Schweickert et al. | 148/175 X |
| 3,222,217 | 12/1965 | Grabmaier | 148/174 X |
| 3,226,254 | 12/1965 | Reuschel | 427/86 |
| 3,686,378 | 8/1972 | Dietze | 264/81 |
| 3,751,539 | 8/1973 | Reuschel et al. | 148/174 |
| 3,950,479 | 4/1976 | Reuschel et al. | 264/81 X |
| 3,966,885 | 6/1976 | May | 264/66 |

Primary Examiner—L. Dewayne Rutledge
Assistant Examiner—W. G. Saba
Attorney, Agent, or Firm—Allison C. Collard

[57] ABSTRACT

A process for making hollow silicon bodies by decomposition from a gaseous compound containing silicon and depositing said silicon on heated carrier bodies, which comprises assembling in a decomposition device a number of board-shaped members of silicon to form a hollow carrier body, heating said body to the decomposition temperature of the gaseous compound, introducing the gas into the device whereby it is thermally decomposed, causing the silicon released thereby to become inseparately united with the hollow carrier body, the hollow silicon body so formed being immediately available for use in the semiconductor industries. The invention also comprises the silicon bodies so made.

1 Claim, 3 Drawing Figures

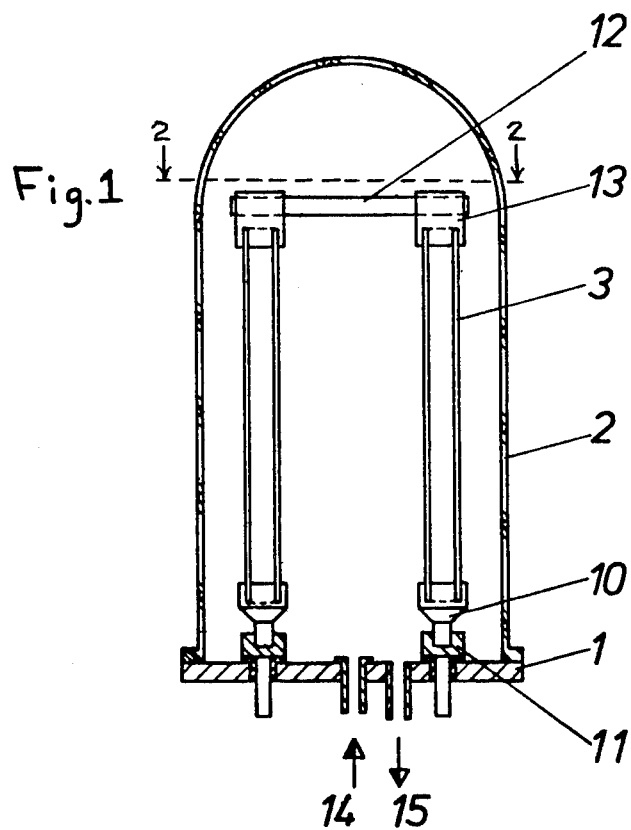
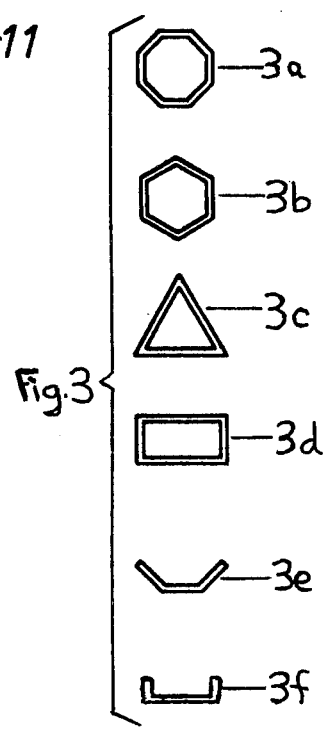
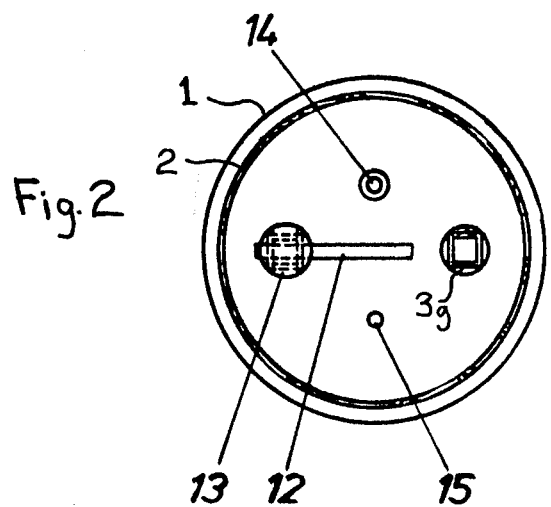

PROCESS FOR MAKING HOLLOW SILICON BODIES AND BODIES UTILIZING BOARD-SHAPED MEMBERS TO FORM THE BASIC GEOMETRIC SHAPE SO MADE

The invention relates to making hollow silicon bodies by deposition of silicon from the gaseous phase on heated carrier bodies assembled from single board-shaped members.

In making semiconductor bodies, particularly for high temperature processes, such as diffusion, oxidation or epitaxial processes, it is preferred in the art to use polycrystalline silicon rather than e.g. graphite or quartz, because of the higher purity of silicon.

From DT-OS Deutsche Offenlegungschrift No. 22 15 143 it is known to make hollow silicon bodies by deposition of polycrystalline silicon on a carrier body of carbon. In order to be able to separate the carrier body after deposition of Si has taken place, the carrier body has to be coated before deposition with a layer of silicon dioxide and subsequently with amorphous silicon.

According to a process described in DT-OS No. 23 21 507, reaction bodies of silicon are made having a flat bottom section or rectangular cross section by depositing silicon on carrier bodies of graphic, the bodies being assembled from single, flat graphite plates. After deposition, the carrier body is removed from the silicon body by oxidation.

Finally, DT-OS No. 23 59 832 describes a process for making thick-walled silicon tubes by deposition of silicon on a directly heated carrier body of silicon, which is coated before the deposition with a surface layer of heat-insulating silicone dioxide or silicon nitride. After the deposition, the carrier body is removed from the silicon body by melting with the heat of a current, while remnants of the heat-insulating layer on the deposited silicon body are eliminated by etching.

All the known process have the important disadvantage that the carrier body has to be removed from the silicon body with considerable energy and expense. Re-use of the carrier body is only possible with the first mentioned process, but in this case, too, re-impregnation with $SiO_2$ and amorphous silicon is necessary.

It is the object of the present invention to provide a process for making hollow bodies of silicon which avoids the expensive, cumbersome, and time-consuming removal of the carrier bodies after deposition of silicon, or, as the case may be, their treatment for re-use.

It is another object of the process according to the invention to prepare the final product in a single operation, by deposition of silicon from the gaseous phase.

The objects of the process according to the invention are accomplished by providing an assembly of wide, preferably board-shaped single carrier members consisting of silicon, depositing silicon on the same from a gaseous, silicon-containing compound, while heating the carrier assembly to the decomposition temperature of the gaseous compound, thereby depositing silicon on the assembled carrier-members for permanent inseparable combination therewith. In this manner, the desired hollow bodies of silicon are produced in a single operation.

Board-shaped silicon carriers can be easily made by sawing in two, polysilicon rods along the longitudinal axis. The board-shaped silicon carriers may have many different cross sections, preferred being silicon members having rectangular or trapezium shaped cross sections; these may be easily assembled to form various hollow bodies of other cross sections, e.g. triangular, square, and, in addition to the rectangular cross sections, polygons with sides of equal or different lengths. Partially open hollow bodies can also be made, e.g. silicon boats, which up to now had to be made from massive silicon bodies by cumbersome and expensive operations.

The cohesion of the board-shaped silicon bodies in forming the desired carriers may be accomplished by several means. In the case of simple hollow bodies having e.g. square or rectangular cross sections, it is generally sufficient to fit them into graphite electrodes having a corresponding square or rectangular groove of about 5 – 15 mm depth cut into them with a width corresponding to the thickness of the board-shaped silicon members.

Another possibility is to glue the single silicon members together with a carbon glue to form the desired carrier assembly. By "carbon glue" it is desired to generally designate adhesives, which will leave only carbon as residue at the high deposition temperature, and in which the gaseous decomposition components do not contain any doping substances for silicon. Instead of carbon glues, it is, of course, possible to use carbon filament or carbon tape, by which the single silicon members are tied together.

After having contacted a source of current and heated the carrier to the deposition temperature of about 1100° to 1200° C, the desired shaped body is deposited by the decomposition of a gas mixture of e.g. trichlorosilane and hydrogen.

As mentioned above, it is preferred according to the invention to put together board-shaped silicon members having a thickness of about 1 to 5 mm. Length and width of the members depend on the desired proportions of the carrier body or, respectively, the hollow silicon body to be deposited, and on the dimensions of the available polycrystalline rod from which the board-shaped silicon members are to be cut. By appropriately fitting or gluing together the board-shaped silicon members, whose edges should preferable be cut to size and pattern, any desired shaped bodies, especially hollow bodies, such as tubes, crucibles, or boats can be made.

The accompanying drawing illustrates an embodiment of a deposition device or reactor for carrying out the process of the invention.

FIG. 1 is a vertical section of the reactor;
FIG. 2 is a section taken along line 2—2 of FIG. 1; and
FIG. 3 shows a number of cross sections which the hollow body to be shaped can assume depending on the carrier-mold provided.

The deposition reactor comprises, as usual, a bottom plate 1, made, e.g. of silver, closed by a bell 2 consisting e.g. of quartz and having a gas tight fit. Inside the bell, two carrier members 3 of silicon are shown which are combined as board-shaped parts. FIG. 3 shows various cross sections of these hollow carriers, viz a regular octogonal cross section 3a, a hexagonal cross section 3b, a triangular one 3c, a rectangular one 3d, an open trough-shaped cross section 3e, having sloping walls, and a trough-shaped cross section 3f with vertical walls. The carrier bodies 3, 3a, 3b – 3f, as well as the member shown at 3g in FIG. 2, which has a square cross section, are fitted at their bottom ends into holding members 10 of electrodes 11 arranged on bottom plate 1. The holding members have grooves of about 5 – 15 mm corresponding in shape to the cross section of the carrier member and in width to the thickness of said members forming the carrier bodies, the holding members preferably consisting of graphite. At the top, the carrier bodies are connected by a conductive bridge 12, likewise consisting, most of the time, of graphite. At both ends of the bridge, holding members 13 are provided which likewise have cut out grooves of about 5 – 15 mm, the cross sections of the grooves corresponding to the hollow cross sections of the carrier body, and being of a width appropriate to accommodate the silicon members forming the carrier bodies. The bottom plate has an inlet 14 and an outlet 15 for gas admission and withdrawal, respectively.

When carrying out the process according to the invention, the carrier bodies are heated up to deposition temperature, between about 1100° and 1200° C, the gaseous compound containing silicon is introduced into the device, whereby silicon is deposited on the carrier, forming an inseparable hollow body therewith.

After the body has been cooled down, it is taken out of the deposition device, any excess material derived from the original carrier is cut off, and the hollow body is ready for use without further mechanical processing. The great advantage of this invention is that the carrier body with the silicon deposited thereon has become a uniform hollow body of the desired dimensions which is at once available. It is a further advantage that even complicated structures of polycrystalline silicon can be produced easily, rapidly and inexpensively.

The process described for silicon can be applied for other materials as well, for instance, for making hollow bodies of germanium.

The hollow bodies obtained by the process can be used advantageously in all high-temperature processes, such as diffusion, oxidation and epitaxial processes in the semiconductor industries where their extreme purity is of high value.

While only several embodiments have been shown and described, it will be obvious to those skilled in the art that many changes and modifications may be made thereunto without departing from the spirit and scope of the invention.

What is claimed is:

1. A process for making hollow silicon bodies by decomposition from a gaseous compound containing silicon and depositing said silicon on heated carrier bodies, which comprises arranging in a decomposition reactor a plurality of board-shaped members of silicon in a geometrical pattern with the edges of adjacent members abutting one another to form a hollow carrier body, heating said body to the decomposition temperature of the gaseous compound by the passage of direct electric current therethrough, introducing the gas into the device whereby it is thermally decomposed, causing the silicon released thereby to become inseparately united with the hollow carrier body, the hollow silicon body so formed being immediately available for use in the semi-conductor industries.

* * * * *